(12) United States Patent
Thummalapally et al.

(10) Patent No.: US 7,848,130 B1
(45) Date of Patent: Dec. 7, 2010

(54) METHOD AND APPARATUS FOR IMPROVING SRAM WRITE OPERATIONS

(75) Inventors: Damodar R. Thummalapally, Milpitas, CA (US); Richard K. Chou, Palo Alto, CA (US)

(73) Assignee: SuVolta, Inc., Los Gatos, CA (US)

( * ) Notice: Subject to any disclaimer, the term of this patent is extended or adjusted under 35 U.S.C. 154(b) by 133 days.

(21) Appl. No.: 12/339,584

(22) Filed: Dec. 19, 2008

(51) Int. Cl.
*G11C 15/00* (2006.01)

(52) U.S. Cl. .................. 365/49.17; 365/49.11; 365/154; 365/168; 365/189.07; 365/189.11

(58) Field of Classification Search ............... 365/49.11, 365/49.17, 154, 168, 189.07, 189.11
See application file for complete search history.

(56) References Cited

U.S. PATENT DOCUMENTS

| | | | |
|---|---|---|---|
| 6,411,538 B1 * | 6/2002 | Kengeri | 365/49.17 |
| 6,674,660 B2 * | 1/2004 | Shau | 365/49.1 |
| 6,845,025 B1 * | 1/2005 | Nataraj | 365/49.1 |
| 6,917,558 B2 * | 7/2005 | Matsuoka et al. | 365/230.01 |
| 7,002,822 B2 * | 2/2006 | Kang et al. | 365/49.17 |
| 7,042,747 B1 * | 5/2006 | Castagnetti et al. | 365/49.15 |
| 7,061,783 B2 * | 6/2006 | Shin et al. | 365/49.15 |
| 7,064,971 B2 * | 6/2006 | Shau | 365/49.15 |
| 7,120,040 B2 * | 10/2006 | Perry et al. | 365/49.11 |
| 7,126,834 B1 * | 10/2006 | Meng et al. | 365/49.11 |
| 7,126,837 B1 * | 10/2006 | Banachowicz et al. | 365/63 |
| 7,158,403 B2 * | 1/2007 | Schmitt | 365/154 |
| 7,170,769 B1 * | 1/2007 | Sachan et al. | 365/49.15 |
| 7,173,837 B1 * | 2/2007 | Bettman et al. | 365/49.17 |
| 7,173,838 B2 * | 2/2007 | Hanzawa et al. | 365/49.1 |
| 7,233,512 B2 * | 6/2007 | Lysinger et al. | 365/49.1 |
| 7,277,306 B2 * | 10/2007 | Noda et al. | 365/49.1 |
| 2008/0308816 A1 | 12/2008 | Miller et al. | 257/76 |

* cited by examiner

*Primary Examiner*—Viet Q Nguyen
(74) *Attorney, Agent, or Firm*—Baker Botts L.L.P.

(57) ABSTRACT

A memory cell includes an access transistor, first and second pull-up transistors, first and second pull-down transistors, and a first search transistor. The access transistor is connected to a first word line and connected between a first bit line and a first data node. The first pull-up transistor is connected to a first power supply point and the first data node, and the second pull-up transistor is connected to the first power supply point and the second data node. The first pull-down transistor is connected to a second power supply point and the first data node, and the second pull-down transistor is connected to the second power supply point and the second data node. The first search transistor is connected to the second data node and includes a source terminal connected to a third power supply point comprising a voltage less than the voltage at the second power supply point.

9 Claims, 4 Drawing Sheets

METHOD AND APPARATUS FOR IMPROVING SRAM WRITE OPERATIONS

TECHNICAL FIELD

This disclosure relates in general to electronic circuits and more particularly to a system and method for improving static random access memory write operations.

OVERVIEW

In memory cell design it is often desirable to have high performance during read and write operations, along with low leakage and low operating voltages. One or more transistors in the memory cell can be made larger to allow for faster read and/or write operation. However, larger transistors can cause problems, such as increased line capacitance, that can hinder the performance of the memory cell. Larger transistors may also consume more power and take up more space than smaller transistors.

SUMMARY OF EXAMPLE EMBODIMENTS

In accordance with one embodiment of the present disclosure, a static random access (SRAM) memory cell includes an access transistor, first and second pull-up transistors, first and second pull-down transistors, and a first and second search transistor. The access transistor is connected to a first word line and connected between a first bit line and a first data node. The first pull-up transistor is connected to a first power supply point and to the first data node, and the second pull-up transistor is connected to the first power supply point and the second data node. The first pull-down transistor is connected to a second power supply point and to the first data node, and the second pull-down transistor is connected to the second power supply point and to the second data node. The memory cell can perform a read operation, a write operation, or reside in an idle state. The first search transistor is connected to the second data node and includes a source terminal connected to a third power supply point comprising a voltage less than the voltage at the second power supply point. The first search transistor may also be connected to a second search transistor in order to implement a ternary content addressable memory (TCAM).

In accordance with another embodiment of the present disclosure, a method for writing to a single-ended SRAM cell comprises, during a write operation, lowering a voltage value at a source terminal of a search transistor with a gate terminal connected to a first data node. The method also includes enabling a word line connected to an access transistor. The method further includes enabling a bit line to write a value of 1 to a second data node in the SRAM cell.

In accordance with yet another embodiment of the present disclosure, a memory cell comprises a first access transistor, first and second pull-up transistors, first and second pull-down transistors, and a depletion-mode transistor. The first access transistor is connected to a word line and connected between a first bit line and a first data node. The first pull-up transistor is connected to a first power supply point and to the first data node, and the second pull-up transistor is connected to the first power supply point and the second data node. The first pull-down transistor is connected to a second power supply point and to the first data node, and the second pull-down transistor is connected to the depletion-mode transistor and to the second data node. The memory cell can perform a read operation, a write operation, or reside in an idle state. The depletion-mode transistor is connected to the word line and to the second power supply point.

In accordance with yet another embodiment of the present disclosure, a method for writing to a single-ended SRAM cell comprises enabling a word line connected to a gate of a depletion-mode transistor connected between a pull-down transistor of the SRAM cell and a power supply point. The method also includes turning off the depletion-mode transistor during the write operation.

Numerous technical advantages are provided according to various embodiments of the present disclosure. Particular embodiments of the disclosure may exhibit none, some, or all of the following advantages depending on the implementation. In certain embodiments, junction field effect transistors (JFETs) can be used to provide faster operation of the memory cell. Moreover, particular embodiments may operate at higher speeds and/or use less power than conventional circuits.

Other technical advantages of the present disclosure will be readily apparent to one skilled in the art from the following figures, descriptions, and claims. Moreover, while specific advantages have been enumerated above, various embodiments may include all, some, or none of the enumerated advantages.

BRIEF DESCRIPTION OF THE DRAWINGS

For a more complete understanding of the present disclosure and its advantages, reference is now made to the following description, taken in conjunction with the accompanying drawings, in which.

DETAILED DESCRIPTION

An SRAM cell can be created with only one bit line and one access transistor. This structure is known as a "single-ended" SRAM cell. With only one bit line, writing data to a single-ended SRAM cell can present some problems that are not present with an SRAM cell that has two bit lines and two access transistors. Certain modifications to a single-ended SRAM cell can be made that provide a faster write operation. The techniques described in this application may be applied to SRAM cells in a variety of applications, such as binary content addressable memory (CAM) cells or ternary CAM (TCAM) cells.

Figure 1:
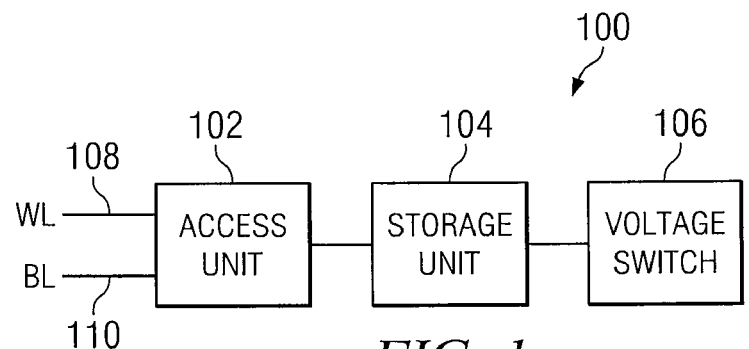
FIG. 1 illustrates a block diagram of one embodiment of a single-ended SRAM cell.

FIG. 1 illustrates a block diagram of one embodiment of a single-ended SRAM cell 100. The components of SRAM cell 100 may be used, in certain embodiments, to provide a faster write operation to one or more memory cells. The components shown in SRAM cell 100 may be arranged and connected in any suitable order.

SRAM cell 100 comprises an access unit 102, a storage unit 104, a voltage switch 106, a word line 108, and a bit line 110. Access unit 102 couples word line 108 and bit line 110 to storage unit 104. Storage unit 104 can store one or more data bits for use in a memory cell. Word line 108 can be used to perform one or more operations on storage unit 104, like a read or a write operation. Bit line 110 may also be used in the one or more operations. In certain embodiments, voltage switch 106 can be used to provide a faster and/or easier write operation to storage unit 104.

Figure 2A:
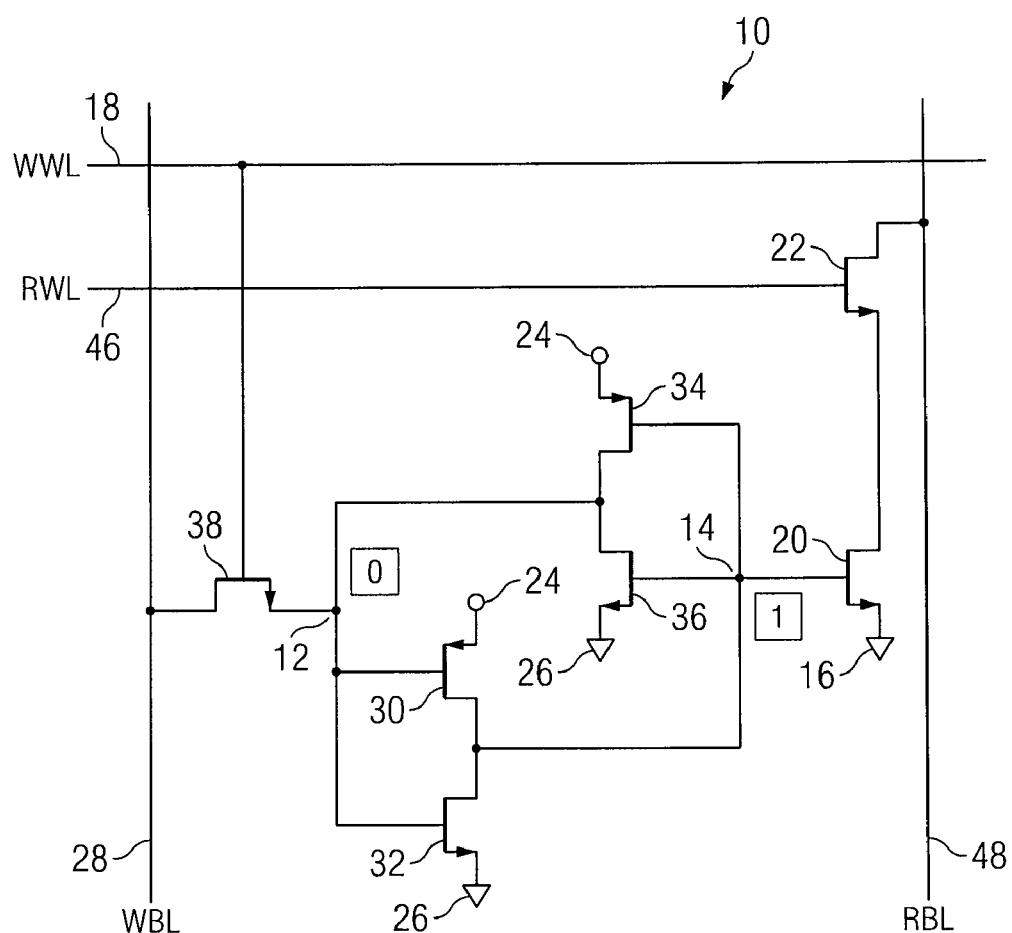
FIGS. 2A-2B illustrate one embodiment of the single-ended SRAM cell depicted in FIG. 1.

FIG. 2A illustrates one example circuit embodiment of a single-ended SRAM cell 10 in accordance with SRAM cell 100 of FIG. 1. SRAM cell 10 includes transistors used for SRAM cell operations and may include transistors used as part of a search operation in, for example, a TCAM. A TCAM is a type of computer memory that allows a user to search the memory for one or more data words.

Transistors 30, 32, 34, and 36 store data bits in SRAM cell 10. Transistor 30 comprises a gate terminal coupled to a node 12, a drain terminal coupled to a voltage supply point 24, and a source terminal coupled to a node 14. Transistor 32 comprises a gate terminal coupled to node 12, a drain terminal coupled to node 14, and a source terminal coupled to a voltage supply point 26. Transistor 34 comprises a gate terminal coupled to node 14, a drain terminal coupled to a voltage supply point 24, and a source terminal coupled to node 12. Transistor 36 comprises a gate terminal coupled to node 14, a drain terminal coupled to node 12, and a source terminal coupled to a voltage supply point 26. Transistors 30 and 34 can be referred to as "pull-up" transistors. Transistors 32 and 36 can be referred to as "pull-down" transistors. Transistor 38 controls access to transistors 30, 32, 34, and 36 during read and write operations of SRAM cell 10. Accordingly, transistor 38 can be referred to as an "access" transistor. Although not shown in FIG. 2A, certain embodiments of this disclosure may contain more than one access transistor.

Data in SRAM cell 10 is stored at nodes 12 and 14. When a logical 1 is stored in SRAM cell 10, node 12 is at a high voltage (also known as a logical 1), and node 14 is at a low voltage (also known as a logical 0). When a logical 0 is stored in SRAM cell 10, the opposite situation occurs and node 12 is at a low voltage and node 14 is at a high voltage. Word line 18 and bit lines WBL 28 control access to SRAM cell 10 and are used in read and write operations, as described in further detail below. SRAM cell 10 comprises one bit line so it is a single-ended SRAM cell.

Transistors 20 and 22 provide an optional read capability for SRAM cell 10. Transistors 20 and 22 may also comprise part of a TCAM cell that can be used to store data. Transistors 20 and 22 may comprise part of a search function in a TCAM cell. Transistor 20 is also used to improve the operation and performance of SRAM cell 10. Transistor 20 comprises a gate terminal connected to node 14, a source terminal connected to a voltage supply point 16, and a drain terminal connected to a source terminal of transistor 22. Transistor 22 further comprises a gate terminal connected to line RWL 46 and a drain terminal connected to line RBL 48. Lines RWL 46 and RBL 48 are search and match lines used for operation of the TCAM cell.

Transistors 20, 22, 30, 32, 34, 36, and 38 in SRAM cell 10 can comprise any suitable type of transistor. As one example, these transistors may comprise JFET or other types of transistors. In certain embodiments, JFET transistors may operate at higher speeds and/or use less power than other types of transistors. As shown in FIG. 2A, transistors 30 and 34 are p-type transistors while transistors 20, 22, 32, 36, and 38 are n-type transistors. However, different configurations of transistor types than that shown for SRAM cell 10 may be implemented as desired while achieving a similar overall operating characteristic for SRAM cell 10 as discussed herein.

SRAM cell 10 further includes a voltage supply point 24 connected to a drain terminal of pull-up transistor 30 and to a drain terminal of pull-up transistor 34. In this embodiment, the voltage at voltage supply point 24 is represented by $V_{DD}$. In certain embodiments, $V_{DD}$ is approximately 0.5 volts. SRAM cell 10 also includes voltage supply point 26 connected to a source terminal of pull-down transistor 32 and a source terminal of pull-down transistor 36. In this embodiment, the voltage at voltage supply point 26 is represented by GND. In certain embodiments, GND is approximately 0 volts, or ground. SRAM cell 10 also includes a voltage supply point 16 connected to a source terminal of transistor 20. The voltage at voltage supply point 16 can be varied to improve the performance of certain functions of SRAM cell 10.

SRAM cell 10 can be designed to achieve high performance with a single-ended structure by including modifications to one or more features of the cell. The basic operating states of an SRAM cell 10 are discussed first below. That is followed by descriptions of certain embodiments of a single-ended SRAM cell 10 that achieve improved operation, especially write operations, of SRAM cell 10.

In basic operation, access to an SRAM memory cell, like SRAM cell 10, is controlled by word line 18. Word line 18 can control access to more than one memory cell; i.e., when word line 18 is activated multiple cells can be written to or read from at the same time. Word line 18 controls access to SRAM cell 10 by controlling access transistor 38. When word line 18 is not enabled, access transistor 38 disconnects SRAM cell 10 from WBL 28. Pull-up transistors 30 and 34 and pull-down transistors 32 and 36 reinforce each other in this state and preserve the data bits stored at nodes 12 and 14.

To access SRAM cell 10 for read or write operations, word line 18 is enabled. In certain embodiments, word line 18 is enabled by raising it to a voltage $V_{DD}$. When this occurs, the voltage at word line 18 turns on access transistor 38, providing WBL 28 access to SRAM cell 10. During write operation into SRAM cell 10, WBL 28 is driven to low level "0" to write "0" into SRAM cell 10 and driven to high level "1" to write "1" into SRAM cell 10.

When data is read from SRAM cell 10, WBL 28 is first precharged to a voltage of approximately $V_{DD}/2$ (or $V_{DD}$). Then word line 18 is enabled, which places a voltage of $V_{DD}$ on the gate of access transistor 38 and turns it on, providing WBL 28 access to SRAM cell 10. The value stored at node 12 is then transferred to WBL 28. For example, if the cell is storing a logical 1, there is a high voltage at node 12, and access transistor 38 and pull-up transistor 34 will reinforce $V_{DD}$ on WBL 28 (a high voltage and a logical 1). Conversely, if the cell is storing a low voltage (logical 0) at node 12, access transistor 38 and pull-down transistor 36 pull WBL 28 down toward a low voltage at voltage supply point 26. During a read operation, the contents of SRAM cell 10 are thus transferred to WBL 28. Further, during a read operation, the values stored at nodes 12 and 14 are not disturbed. After the read operation, when word line 18 is no longer asserted, access transistor 38 again disconnects SRAM cell 10 from WBL 28, and the data bits stored at nodes 12 and 14 are preserved.

To write data to SRAM cell 10, the write cycle begins by applying the value to be written to WBL 28. For example, if a logical 0 needs to be written to SRAM cell 10, WBL 28 is set to a low voltage (logical 0). Word line 18 is then asserted and access transistor 38 provides WBL 28 access to SRAM cell 10. The voltage value stored on WBL 28 is driven into SRAM cell 10, overriding the previous states stored at nodes 12 and 14. SRAM cell 10 stabilizes at its new state. Word line 18 can then be turned off, causing access transistor 38 to disconnect WBL 28 from SRAM cell 10. The new value is thus stored in SRAM cell 10.

If a logical 1 needs to be written to an SRAM cell 10 that is storing a logical 0, WBL 28 is set to a high voltage (logical 1), and a similar write process occurs as described above. However, writing a logical 1 to SRAM cell 10 can be difficult with certain types of SRAM cells 10. To write a logical 1, word line 18 places a voltage of $V_{DD}$ on the gate of access transistor 38. Access transistor 38 then has a voltage difference between its gate and its source ($V_{GS}$) of $V_{DD}$ This turns access transistor 38 on. When access transistor 38 is turned on, the voltage value at the drain of access transistor 38 is passed to the source of transistor 38, which is connected to node 12. WBL 28 is connected to the drain of access transistor 38, so when word line 18 turns access transistor 38 on, the value at WBL 28 (in this case, $V_{DD}$) is passed to node 12 and the node is overwritten. However, in certain embodiments of SRAM cell 10, there is a threshold voltage drop across access transistor 38 of approximately $V_{TH}$. Therefore the value at node 12 is $V_{DD}$-$V_{TH}$, and not $V_{DD}$. When a logical 0 is stored at node 12, pull-down transistor 36 is turned on, pulling the value of node 12 toward the voltage at voltage supply point 26, which is 0 volts in this case. These two transistors (38 and 36) act against each other and can create difficulties in trying to write a logical 1 to node 12. In certain embodiments, this problem can be overcome by making access transistor 38 bigger (and thus stronger) than pull-down transistor 36, allowing it to more easily write a logical 1 to node 12. However, this increase in size can also increase the capacitive load on WBL 28, slowing down the read speed of SRAM cell 10. Another possible solution is to "weaken" pull-down transistor 36 during write operations so that node 12 can be written to more easily.

Figure 2B:
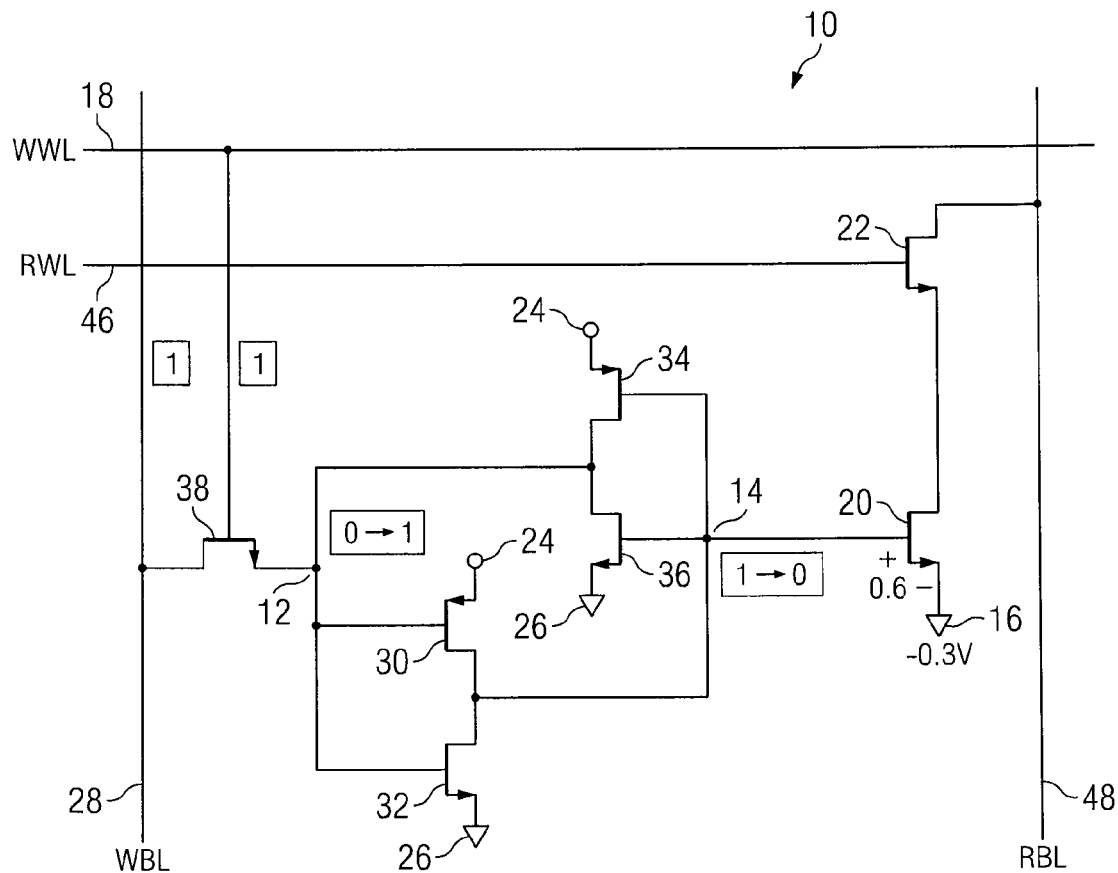

FIG. 2B shows one example circuit embodiment of SRAM cell 10 during an attempt to write a logical 1 to node 12 of the cell. In this embodiment, a logical 1 is placed on WBL 28 and word line 18 is enabled. This turns on access transistor 38 and the value of 1 at the drain of access transistor 38 is passed to node 12 to write the logical 1 to the cell. However, pull-down transistor 36 is also on and attempts to keep node 12 at a logical 0 by pulling it towards voltage supply point 26. One way to weaken pull-down transistor 36 is to lower the voltage at voltage supply point 16.

When SRAM cell is in an idle state or a read state, voltage supply point 16 can comprise a voltage value of 0 volts. However, when attempting to write a logical 1 to node 12 in SRAM cell 10, the write can be made easier by lowering the voltage at voltage supply point 16. In certain embodiments, the voltage can be lowered to approximately −0.3 volts. If transistor 20 is a JFET, lowering the voltage value at the source of transistor 20 forward biases the transistor. Node 14 at the gate of transistor 20 is storing a logical 1 (approximately 0.5 V), so the voltage difference between the gate and the source of transistor 20 ($V_{GS}$) is approximately 0.8 V. Transistor 20 will act as a diode and pull down the voltage at the gate to lower $V_{GS}$ to approximately 0.6 V. Since the source is at −0.3 V, this means that the voltage at the gate will be pulled down to approximately 0.3 V from its original value of 0.5 V. This 0.3 V is now at node 14 and at the gate of pull-down transistor 36, creating a $V_{GS}$ for pull-down transistor 36 of approximately 0.3 V. This value is lower than the previous value of $V_{GS}$ for pull-down transistor 36, which was 0.5 V. Lowering the voltage at the gate of pull-down transistor 36 makes the transistor current weaker, allowing access transistor 38 to more easily overwrite the logical 0 at node 12. Once the new value has been written to SRAM cell 10, the voltage at power supply point 16 can be returned to its original value of 0 volts, and remain at that value until the next write operation. Thus, this embodiment can allow a logical 1 to be more easily written to the cell without increasing the size of access transistor 38 relative to pull-down transistor 36.

Figure 3:
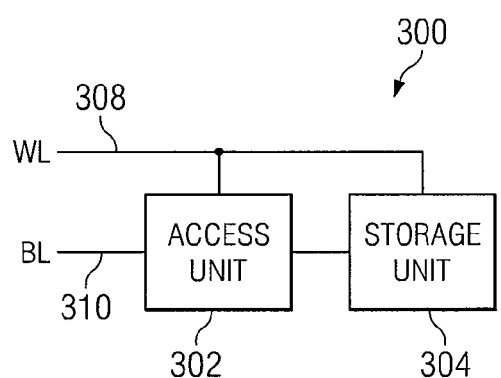
FIG. 3 illustrates a block diagram of another embodiment of a single-ended SRAM cell.

FIG. 3 illustrates a block diagram of another embodiment of a single-ended SRAM cell 300. The components of SRAM cell 300 may be used, in certain embodiments, to provide a faster write operation to one or more memory cells. The components shown in SRAM cell 300 may be arranged and connected in any suitable order.

SRAM cell 300 comprises an access unit 302, a storage unit 304, a word line 308, and a bit line 310. Access unit 302 couples word line 308 and bit line 310 to storage unit 304. Storage unit 304 can store one or more data bits for use in a memory cell. Word line 308 can be used to perform one or more operations on storage unit 304, like a read or a write operation. Bit line 310 may also be used in the one or more operations. In certain embodiments, world line 308 can also be directly coupled to storage unit 304 and be used to provide a faster and/or easier write operation to storage unit 304. This can be done, for example, by using word line 308 to turn on or turn off one or more transistors within storage unit 304.

Figure 4A:
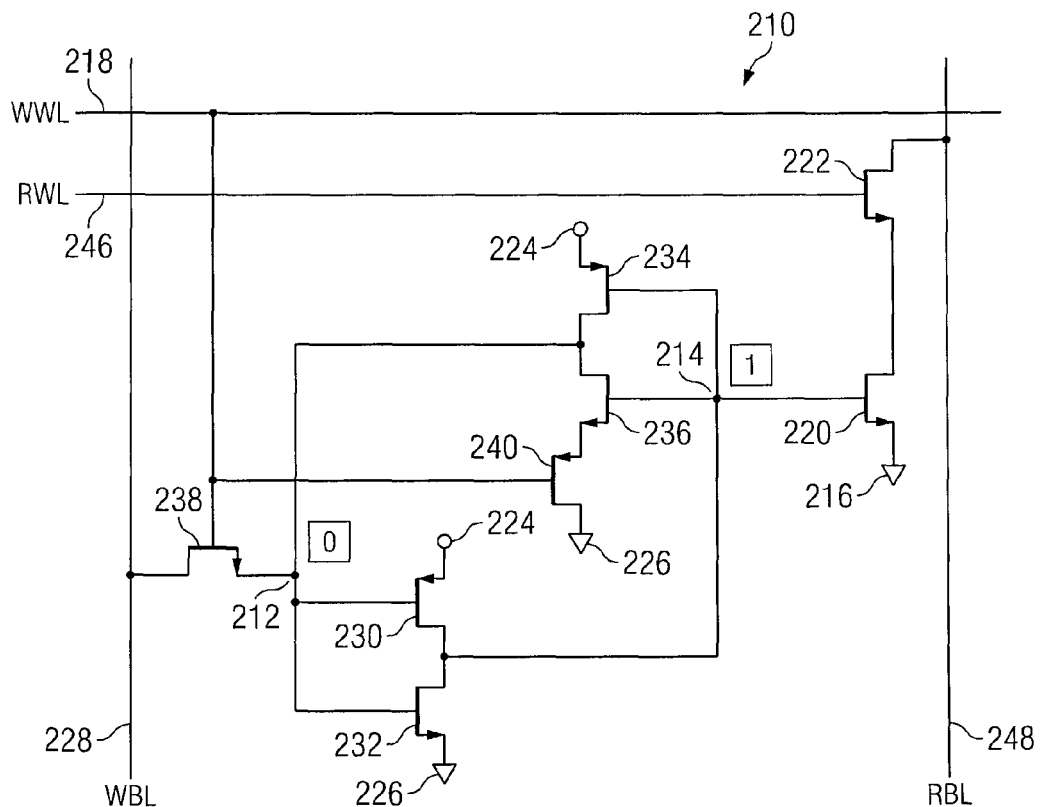
FIGS. 4A-4B illustrate one embodiment of the single-ended SRAM cell depicted in FIG. 3.

FIG. 4A illustrates an example circuit embodiment of a single-ended SRAM cell 210 in accordance with SRAM cell 300. SRAM cell 210 in FIG. 4A is similar in structure and function to SRAM cell 10 in FIG. 2A except for the addition of depletion-mode transistor 240 and without the feature of lowering the voltage at supply point 216. Depletion-mode transistor 240 comprises a gate terminal connected to word line 218, a drain terminal connected to a source terminal of pull-down transistor 236, and a source terminal connected to power supply point 226.

The basic operation of SRAM cell 210 is also similar to the operation of SRAM cell 10. With SRAM cell 210, access to the cell is controlled by word line 218 and access transistor 238. Data is stored at nodes 212 and 214. When SRAM cell 210 is in an idle state and a logical 0 is stored at node 212, depletion p-type transistor 240 is turned on. Word line 218 is at a logical 0, so 0 volts is also on the gate terminal of depletion p-type transistor 240, which turns this transistor on and provides a path to ground at voltage supply point 226 for pull-down transistor 236. Pull-down transistor 236 and depletion p-type transistor 240 thus hold node 212 at logical 0.

Figure 4B:
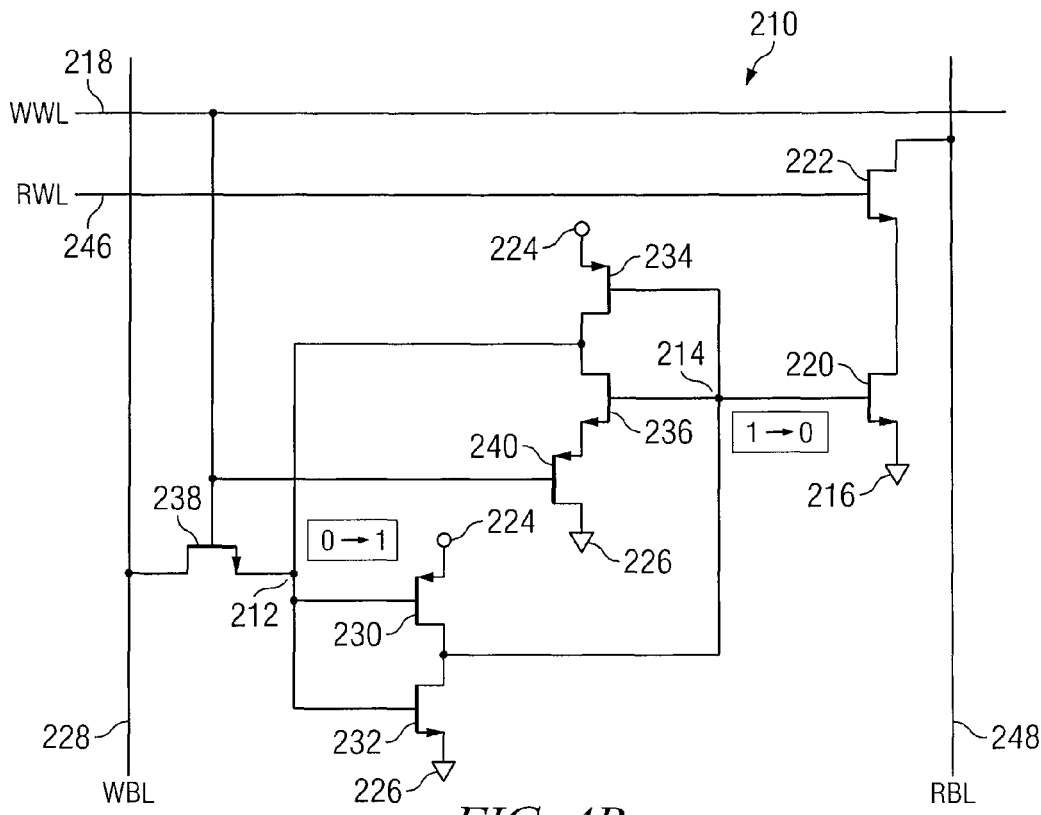

FIG. 4B shows one example embodiment of SRAM cell 210 during an attempt to write a logical 1 to node 212 of the cell. In this embodiment, a logical 1 is placed on WBL 228 and word line 218 is enabled. This turns on access transistor 238 and the value of 1 at the drain of access transistor 238 is passed to node 212 to write the logical 1 to the cell. In an SRAM cell without depletion p-type transistor 240, pull-down transistor 236 would be on and would attempt to keep node 212 at a logical 0 by pulling it towards voltage supply point 226. However, depletion p-type transistor 240 assists in the operation of writing a logical 1 to node 212.

When a write operation is performed on SRAM cell 210, word line 218 is enabled by placing a logical 1 on word line 218, and a logical 1 is placed on WBL 228. In certain embodiments, word line 218 receives a voltage of approximately 0.5 volts. This 0.5 volts turns on access transistor 238 so that the write operation can be performed. Additionally, word line 218 is connected to the gate terminal of depletion p-type transistor 240. A 0.5 volt charge on this gate terminal creates a $V_{GS}$ of 0.5 volts, which turns off depletion p-type transistor 240. When depletion p-type transistor 240 is off, pull-down transistor 236 loses its path to ground at voltage supply point 226. This makes it more difficult for pull-down transistor 236 to hold node 212 at a logical 0. Because of this difficulty, access transistor 238 can more easily write the value of WBL 228 (logical 1) to node 212. The addition of depletion p-type transistor 240 to SRAM cell 210 thus provides an easier write operation without increasing the size of access transistor 238.

Figure 5:
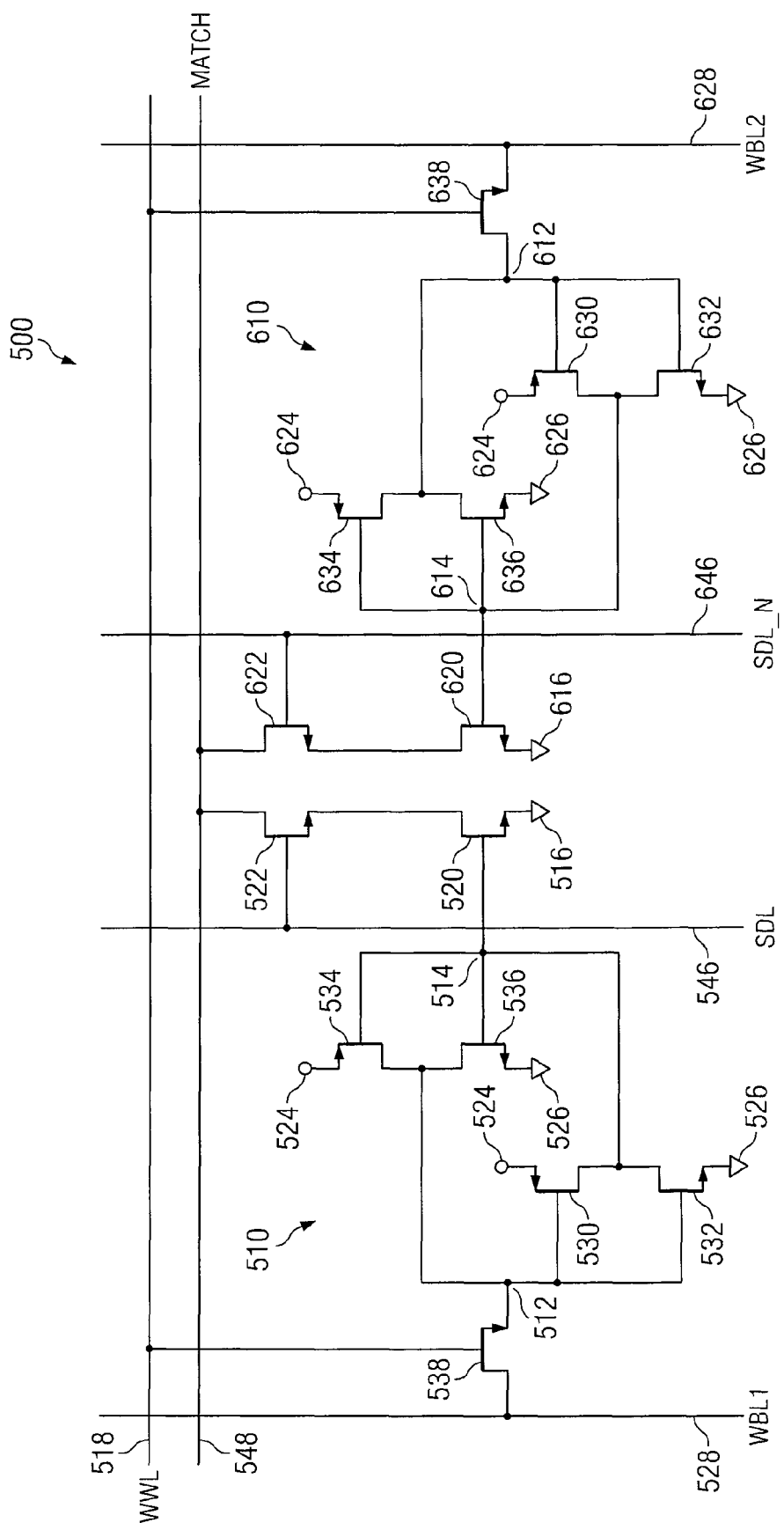
FIG. 5 illustrates one example embodiment of a TCAM cell.

FIG. 5 illustrates one example embodiment of a TCAM cell 500. A TCAM cell can store one or more data bits and can perform a search on those one or more data bits. TCAM cell 500 comprises a pair of single-ended SRAM cells 510 and 610 and various search transistors. The first SRAM cell 510 is comprised of transistors 530, 532, 534, 536, and 538. The second SRAM cell 610 is comprised of transistors 630, 632, 634, 636, and 638. The search transistors 520, 522, 620, and 622 can be used to perform one or more search operations on the data bits stored in the SRAM cells 510 and 610. The numbered components in FIG. 5 can be similar in structure and function to the numbered components in FIGS. 2A, 2B, 4A, and 4B, where like numbers denote like components. For example, bit line 528 in FIG. 5 may be similar in structure and function to bit line 28 in FIGS. 2A and 2B and bit line 228 in FIGS. 4A and 4B. The SRAM cells 510 and 610 in TCAM cell 500 are shown using a technique similar to that described with respect to FIGS. 2A and 2B for performing a write operation, where search transistors 520 and 620 aid in the write operation in response to a change in the power supply voltage as described above. Additionally, TCAM cell 500 may employ one or more depletion p-type transistors (not shown in FIG. 5) as described above with respect to FIGS. 4A and 4B to perform a write operation to one or more of the SRAM cells as described above. TCAM cell 500 may include one, the other, or both types of SRAM cells 10 and 210. In addition, though a specific embodiment is shown for the search transistors, TCAM cell 500 may employ any type of transistor and transistor circuit design for operation in order to provide the TCAM function.

In TCAM cell 500 in FIG. 5, data bits are stored in each of two SRAM cells 510 and 610 in TCAM cell 500. Data can be read from or written to each of the SRAM cells 510 and 610 using standard SRAM reading and writing procedures. The searching function is performed with respect to the values at nodes 514 and 614. Node 514 has a complementary value of node 512 and node 614 has a complementary value of node 514. To perform a search (or "match") operation on TCAM cell 500, the matchline 548 (similar to RBL 48 of FIGS. 2A and 2B and RBL 248 of FIGS. 4A and 4B) is precharged to $V_{DD}$. The search operation consists of two phases: pre-charge of matchline 548 followed by an evaluation of matchline 548. Search lines SDL 546 and SDL_N 646 are driven to logic low level (GND) during the matchline 548 pre-charge phase. The search lines SDL 546 and SDL_N 646 (similar to RWL 46 of FIGS. 2A and 2B and RWL 246 of FIGS. 4A and 4B) are driven respectively to a search key data value and a complement of the search key data value during the matchline 548 evaluation phase. Matchline 548 will not discharge if a match is detected. If there is a mismatch, then matchline 548 will discharge. Any number of bits can be placed in parallel with a common matchline 548, and if any one of the bits mismatches, then matchline 548 will discharge. Matchline 548 will remain charged only if all the stored bits match the bits in accordance with the respective search lines SDL 546 and SDL_N 646. Table 1 shows a truth table identifying when matches and mismatches occur.

TABLE 1

| Node 514 | Node 614 | SDL/SDL_N | Matchline 548 State |
|---|---|---|---|
| 0 | 1 | 1/0 | Match (remains at precharge $V_{DD}$) |
| 0 | 1 | 0/1 | Mismatch (discharges to GND) |
| 1 | 0 | 0/1 | Match |
| 1 | 0 | 1/0 | Mismatch |
| 1 | 1 | 0/1 | Mismatch |
| 1 | 1 | 1/0 | Mismatch |
| 0 | 0 | don't care | Match |
| don't care | don't care | 0/0 | Match |

Although the present disclosure has been described with several embodiments, a myriad of changes, variations, alterations, transformations, and modifications may be suggested to one skilled in the art, and it is intended that the present disclosure encompass such changes, variations, alterations, transformations, and modifications as fall within the scope of the appended claims.

What is claimed is:

1. A memory cell, comprising:
   an access transistor, wherein the access transistor is connected to a first word line and connected between a first bit line and a first data node;
   first and second pull-up transistors, wherein the first pull-up transistor is connected to a first power supply point and to the first data node, and wherein the second pull-up transistor is connected to the first power supply point and the second data node;
   first and second pull-down transistors, wherein the first pull-down transistor is connected to a second power supply point and to the first data node, and wherein the second pull-down transistor is connected to the second power supply point and to the second data node; and
   a first search transistor connected to the second data node and comprising a source terminal connected to a third power supply point comprising a voltage less than the voltage at the second power supply point.

2. The memory cell of claim 1, wherein the access transistor, first and second pull-up transistors, first and second pull-down transistors, and first search transistors comprise junction field effect transistors.

3. The memory cell of claim 1, wherein the first power supply point comprises a voltage of 0.5 volts.

4. The memory cell of claim 1, wherein the second power supply point comprises a voltage of 0 volts.

5. The memory cell of claim 1, wherein the third power supply point comprises a voltage of −0.3 volts during one or more write operations.

6. The memory cell of claim 1, wherein the third power supply point is switched to a voltage of −0.3 volts during one or more write operations.

7. The memory cell of claim 6, wherein the third power supply point is switched when writing a logical 1 to the cell.

8. The memory cell of claim 1, wherein the memory cell can perform a read operation, a write operation, or reside in an idle state.

9. The memory cell of claim 1, wherein the memory cell comprises a second search transistor connected to the first search transistor to implement a ternary content addressable memory cell.

* * * * *